United States Patent
Patrascu

(10) Patent No.: US 11,183,263 B2
(45) Date of Patent: Nov. 23, 2021

(54) METHOD OF ERROR DETECTION IN A TERNARY CONTENT ADDRESSABLE MEMORY

(71) Applicant: TTTech Computertechnik Aktiengesellschaft, Vienna (AT)

(72) Inventor: Costel Patrascu, Buchare (RO)

(73) Assignee: TTTECH COMPUTERTECHNIK AKTIENGESELLSCHAFT, Vienna (AT)

( * ) Notice: Subject to any disclaimer, the term of this patent is extended or adjusted under 35 U.S.C. 154(b) by 0 days.

(21) Appl. No.: 17/003,272

(22) Filed: Aug. 26, 2020

(65) Prior Publication Data

US 2021/0065833 A1 Mar. 4, 2021

(30) Foreign Application Priority Data

Aug. 30, 2019 (EP) .................................. 19194611

(51) Int. Cl.
*G11C 29/10* (2006.01)
*G11C 29/44* (2006.01)
(Continued)

(52) U.S. Cl.
CPC .............. *G11C 29/44* (2013.01); *G11C 15/04* (2013.01); *G11C 29/10* (2013.01); *G11C 29/1201* (2013.01); *G11C 29/42* (2013.01)

(58) Field of Classification Search
CPC ......... G11C 29/44; G11C 15/04; G11C 29/10; G11C 29/1201; G11C 29/42;
(Continued)

(56) References Cited

U.S. PATENT DOCUMENTS

2007/0061692 A1 3/2007 Wickeraad
2012/0117431 A1 5/2012 Bremler-Barr et al.
(Continued)

OTHER PUBLICATIONS

Search Report for European Patent Application No. 19194611.0, dated Mar. 9, 2020 (1 page).

*Primary Examiner* — Mohammed A Bashar
(74) *Attorney, Agent, or Firm* — Eversheds Sutherland (US) LLP

(57) ABSTRACT

A method is provided for error detection in a ternary content addressable memory, TCAM, preferably in real-time, wherein the error detection is initiated with a read operation at a specified input address (200), wherein an additional random access memory, RAM, is provided, wherein said RAM has the same number of locations as the TCAM, wherein in both memories, TCAM and RAM, corresponding read data entries (210) which each consist of data and a mask are placed at the same address locations. In addition, a method is provided for error detection in a TCAM, preferably in real-time, wherein the error detection is triggered by the found of searched input key (400) and starts with a read operation at a specified memory address (410), wherein an additional RAM is provided, wherein said RAM has the same number of locations as the TCAM, wherein in both memories, TCAM and RAM, corresponding read data entries (420) which each consist of data and a mask are placed at the same address locations.

17 Claims, 4 Drawing Sheets

(51) Int. Cl.
*G11C 15/04* (2006.01)
*G11C 29/12* (2006.01)
*G11C 29/42* (2006.01)

(58) Field of Classification Search
CPC .... G11C 2029/0409; G11C 2029/0411; G11C 29/52; G06F 11/1004
See application file for complete search history.

(56) References Cited

U.S. PATENT DOCUMENTS

| | | | |
|---|---|---|---|
| 2015/0006808 A1* | 1/2015 | Miller | G11C 15/04 |
| | | | 711/108 |
| 2016/0283316 A1 | 9/2016 | Abali et al. | |
| 2016/0283317 A1* | 9/2016 | Abali | G06F 11/1004 |
| 2019/0325962 A1* | 10/2019 | Sheikh | G06F 11/1064 |

\* cited by examiner

METHOD OF ERROR DETECTION IN A TERNARY CONTENT ADDRESSABLE MEMORY

CROSS-REFERENCE TO RELATED APPLICATIONS

This application claims priority to European Patent Application No. 19194611.0, filed Aug. 30, 2019, which is incorporated herein by reference.

FIELD OF THE INVENTION

The invention relates to a method for error detection in a ternary content addressable memory, TCAM, preferably in real-time, wherein the error detection is initiated with a read operation at a specified input address.

Furthermore, the invention relates to a method for error detection in a ternary content addressable memory, TCAM, preferably in real-time.

This invention relates generally to computing and device networking. More particularly, the present invention relates to a real-time error detection mechanism in a ternary content addressable memory (TCAM).

BACKGROUND OF THE INVENTION

The Ternary Content Addressable Memory (TCAM) is a specialized content addressable memory (CAM) which is designed for rapid table lookups searching on longest matches, such as IP routing tables organized by IP prefixes. The TCAM as a type of CAM memory has the bits stored in a data entry and can have three different bit values for purposes of matching to the input word ("1", "0" and "don't care"). Each TCAM entry has three entities: value, mask and result. The value is a pattern that will be matched (e.g. IP/MAC addresses). The mask consists of mask bits (0, 1, and "don't care") associated with the value pattern and represents the prefix. The result is a positive result in the case where a lookup search finds the pattern and mask. During the search operation, TCAM compares input data with all valid data entries stored in TCAM, gives a list of multiple matches and determines the first address which provides a match for the compared data. More precisely, in one clock cycle the input data is compared with each valid data stored in the TCAM. A positive match result for a TCAM entry is obtained when all bits match the data stored. A "don't care" data bit stored in TCAM will provide match when it is compared with an input data bit no matter which value the input data bit has.

Considering data integrity errors in TCAM, such errors are usually introduced by cosmic rays emission and ionizing radiation. These types of errors are characterized as so-called soft errors. In addition to these soft errors there is another kind of errors named search errors. Due to the fact that the input for a TCAM search is a search key and the output is the first address which provides a match for the compared key, a search error may be introduced. A search error may result either in a false matching (false hit), when a search key hits a wrong entry, i.e. a lower-priority entry or an entry which should not provide a match for said search key, or an entry rejects a search key (false miss) although it should have been matched.

Soft errors in TCAMs are more damaging than soft errors in RAMs. While a soft error in RAM only causes a failure of a single lookup, a soft error in a TCAM may cause many different lookups to fail due to the first matching semantics. This happens because the lookup result of a search key is the index of the first entry that the key matches. Soft errors induce the highest failure rate of many known reliability mechanisms used in TCAMs.

Data stored in a TCAM cannot be easily protected. TCAM data error protection has been considered as a complex process because it requires reading and matching of TCAM entries before detecting errors. These operations consume integrated circuits bandwidth and power. It is desirable to protect TCAM data because TCAMs may be used to store network routing and other information. TCAM based devices may perform high-speed packet classification used in many networking applications. In order to support a packet classification, a TCAM performs millions of key search operations per second and consumes a lot of power. Additionally, TCAMs have the problem of poor flexibility in words length variations.

There are many publications that consider the context of error detection in TCAM. U.S. Pat. No. 8,473,832 B2 describes a method for performing mutually exclusively shared functions on a plurality of entered words in TCAM in order to detect data corruption using word compare and parity error check. Patent application US2016/0283317 A1 also discloses a method of error detection in TCAM that compares the computed TCAM word checksum to the stored value of a checksum retrieved from a RAM that matched the query. The method of error detection during TCAM search presented in U.S. Pat. No. 9,170,880 B1 includes generating and storing an error correction code (ECC) and data in a TCAM, generating the ECC for a search key, and detecting any error in the stored data by using the search key with appended ECC.

Traditional methods such as error correcting codes are difficult to apply to TCAMs. Namely, the most of TCAM error detection and correction schemes require hardware modifications to the TCAM circuitry. A software method that can detect and fix errors during the search process which does not require hardware changes to the TCAM circuitry is a solution presented in the paper "*TCAMChecker: A Software Approach to the Error Detection and Correction of TCAM-Based Networking Systems*", published in Journal of Network and Systems Management, 21(3), September 2013, DOI:10.1007/s10922-012-9238-0.

SUMMARY OF THE INVENTION

It is an object of the present invention to provide a method for detecting errors, in particular data integrity errors and/or addressing errors and/or search errors which can occur in a TCAM.

This object is achieved with a method for error detection in a ternary content addressable memory, TCAM, preferably in real-time, wherein the error detection is initiated with a read operation at a specified input address, wherein according to the invention an additional random access memory, RAM, is provided, wherein said RAM has the same number of locations as the TCAM, wherein in both memories, TCAM and RAM, corresponding read data entries which each consist of data and a mask are placed at the same address locations, and wherein data and mask read operations from TCAM and RAM at the locations pointed by the input address are performed and in a first check phase said data and mask read from the TCAM at the location pointed by the input address are compared with the data and mask read from RAM at the location pointed by the same input address, and if the result of the first check phase is correct, a TCAM search phase is executed, otherwise a data recovery check is executed, which is followed by a data refresh, a second read of data entries stored at said input address in both TCAM and RAM, and a second check phase is executed, in which second phase a comparison of data and masks read from both TCAM and RAM is performed, and wherein the TCAM search phase uses the data read from RAM as input search key and returns as an output a TCAM match vector and/or a single TCAM address, and wherein a TCAM match check checks in the case of a TCAM match vector, whether the result of the TCAM search, that is a flag pointed by the address from TCAM match vector, is binary 1, or in the case of a non-matched (false) TCAM single address checked in a TCAM address check, and if the TCAM address is a lower address than said input address, a TCAM read at said TCAM address is performed, and if in a TCAM search validation the TCAM data read at the TCAM address is identical to the data read at the RAM, and wherein preferably the method moves to the next input address provided by the scrubbing mechanism, and the whole proposed error detection method may be repeated.

Preferably, a check and phases that use TCAM and RAM low memory bandwidth demanding procedure of data entries check and comparison may be provided.

Preferably, a check and phases that use TCAM and RAM high memory bandwidth demanding procedure of data entries check and comparison, which includes error correction code or hash algorithms may be provided.

It may be provided that the data recovery check raises a data integrity error flag, if the result of the check is false.

A second check phase may be provided that raises a data integrity error flag, if the result of the check is false.

A TCAM match check may be executed, which finishes the error detection if the result of the check is a binary 1, otherwise it raises a search error flag.

A TCAM search validation may be executed, which raises a search error flag, if the result of a comparison of data read at the TCAM address does not provide a match in the RAM.

Furthermore, the object is achieved with a method for error detection in a ternary content addressable memory, TCAM, preferably in real-time, wherein according to the invention an additional random access memory, RAM, is provided, wherein said RAM has the same number of locations as the TCAM, wherein in both memories, TCAM and RAM, corresponding read data entries which each consist of data and a mask are placed at the same address locations, and wherein the error detection is initiated by a received input address outputted from a TCAM_SEARCH command, wherein a memory read reads data and the mask stored at said input addresses in either TCAM and/or RAM, and wherein a check checks the integrity of said data and the mask, and if no error is found, a key match check is executed, in which the input search key is compared with the data and the mask located at the address in the memory, either TCAM and/or RAM.

Preferably, the read of the data value and the mask is performed at the RAM, in particular in the case of low available bandwidth of the TCAM, or, in particular if the available bandwidth of the TCAM is high, the memory read is performed at the TCAM.

An integrity check of the data and the mask may be executed.

A key match check may be executed, and if there is no match between the input search key and the data and the mask read from address, a search error will be indicated.

According to the invention, an additional RAM having the same number of entries as the TCAM is used, wherein said additional RAM implements a scrubbing mechanism, in particular a scrubbing mechanism which is executed during run-time. Additionally, a run-time data integrity check mechanism, which can signal the integrity of the data stored in the TCAM when the data is read, and a run-time search integrity check mechanism are implemented.

The present invention describes a method which can be used to detect, during run-time, the soft and search errors which can occur in a TCAM. The proposed method may detect errors more reliably than previously known techniques. The method according to the invention is characterized by three main features: detection of both data integrity and search types of errors; considering different search mechanism outputs; and an applicability in TCAMs with different memory bandwidth. Moreover, the present invention uses an additional RAM memory. The RAM memory needs to have the same number of locations as primary TCAM memory. In both memories, TCAM and RAM, corresponding entries that consist of the data and the mask are placed at the same address locations. Each read operation from TCAM memory automatically trigger a read from the same address in RAM memory and a data integrity check mechanism based on the additional data stored in RAM.

In order to achieve the objective mentioned above, the presented TCAM error detection method provides several implementations that depend on the TCAM available bandwidth; primary TCAM command performed, i.e. read or search commands; and considered search outputs, i.e. search vectors and/or single addresses. In the first two invention embodiments are represented procedures which can be activated during scrubbing by the TCAM primary read command, considering separately cases of the procedures' inner search operation different outputs, i.e. search vector or single address, respectively. Third embodiment represents the implementation of the present invention activated by the TCAM primary search command.

The first embodiment of the presented invention represents a real-time TCAM error detection method which is initiated by a given input address and characterized by a match vector as result of the method's inner TCAM search phase. It uses additional RAM and read data entry at the same input addresses in both memories, and then compare them using different data integrity check procedures depending on TCAM available bandwidth. If needed, data recovery is performed that includes data integrity check of refreshed and again read data from both memories. The method continues with a TCAM search phase that uses data previously read from RAM or TCAM as input search key and it returns as an output TCAM match vector. Then, if the value of the flag from the output TCAM match vector indexed by the given input address is found '1' the method is finished, otherwise it raises a search error flag.

In the second embodiment of the presented invention a TCAM error detection method in real-time is described, initiated by a given input address and characterized by a single address as result of the method's inner TCAM search phase. It uses additional RAM and performs the same phases as described with respect to the previous embodiment, including data entry read in both memories, their comparison using different data integrity check, data recovery and repeated data integrity check if it is needed. The method continues with the TCAM search phase that uses data read from RAM as input search key and it returns a single address. Then, the given input address is compared with an output of TCAM search phase and in a case of the false match, it is checked if the TCAM address is higher address in the TCAM than said input address. If the result of this check is true the method raises a search error flag. Otherwise, a TCAM read at that address is performed, while if data read at the TCAM address provides a match for the key previously searched, then the method moves to the next input address provided by the scrubbing mechanism, and the whole proposed error detection method may be repeated. If the result of the previous TCAM_search check is false or TCAM data check with data read from RAM is false, the method raises a search error flag.

A third embodiment of the present invention describes method of error detection in a TCAM, in real-time, which is initiated by received input address output from TCAM primary search command that read the data and the mask stored at input addresses in TCAM and/or RAM, depending on TCAM available memory bandwidth and checks integrity of the data and the mask. The integrity check uses simple or more complex approach depending on TCAM available memory bandwidth, and if no error is found, the method performs comparison of an input search key of TCAM primary search command and the entry read in this procedure.

The invention also relates to a memory device for the use in a method described above, wherein the memory device comprises a ternary content addressable memory, TCAM, preferably in real-time, and an additional random access memory, RAM, wherein said RAM has the same number of locations as the TCAM, wherein in both memories, TCAM and RAM, corresponding read data entries which each consist of data and a mask may be placed at the same address locations.

In addition, the invention relates to a device, for example a networking device, in particular a high speed networking device, such as a router or a switch, or a TCAM-based high speed search engine comprising such a memory device.

BRIEF DESCRIPTION OF THE DRAWINGS

In the following, in order to further demonstrate the present invention, illustrative and non restrictive embodiments are discussed, as shown in the drawings, which show.

DETAILED DESCRIPTION

Figure 1:
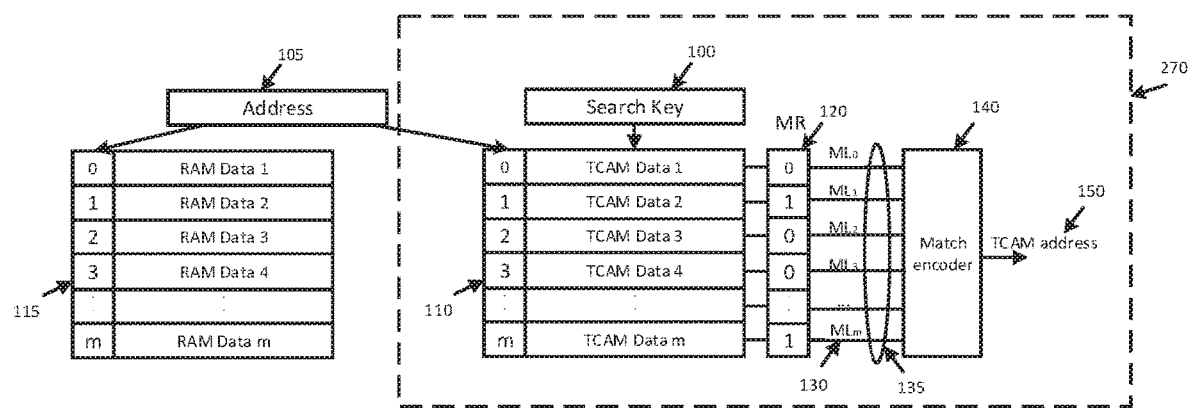
FIG. 1 represents a schematic general principle of a searching process and the additional RAM used in the integrity check process.

The invention describes a method which can be used to detect, during run-time, errors which can occur in a TCAM memory. The method is characterized by three aspects: detection of both data integrity and search errors; considering different search mechanism outputs; and an applicability to various available memory bandwidths. According to the first feature, there are two types of errors which the proposed method may detect: data integrity errors which refer to the integrity of the stored data and addressing error, and searching errors. Besides these types of errors, the proposed method discriminates two cases of search outputs: in a first case multiple hits of search keys found in TCAM memory array are delivered while in the second case the output of a searching mechanism is a single address. In the first case priority rules are used to encode a final output address. Finally, the third feature relates to an implementation of the proposed method that supports an optimization solution to the available memory bandwidth. In conditions where the available memory bandwidth is low, the method may implement a simple direct comparison of data and addresses supported by checksum/parity bit operations, while in high memory bandwidth conditions, the proposed method may implement more complex approaches, such as hash or error code correction (ECC) algorithms.

In addition to these three aspects of the invention, the method requires involvement of an additional RAM memory. The RAM memory needs to have the same number of locations as the primary TCAM memory. In both TCAM and RAM memories, corresponding entries that consist of data and a mask are placed at the same address locations.

The following TCAM and RAM commands, employed in the proposed error detection method, are explained:

The TCAM_DATA_READ (address) command will return the "data" stored in the TCAM memory at the location pointed by the "address". The output of this command is "tcam_data".

The TCAM_MASK_READ (address) command will return the "mask" stored in the TCAM memory at the location pointed by the "address". The output of this command is "tcam_mask".

The TCAM_DATA_READ and the TCAM_MASK_READ commands may be considered as atomic operations and may be noted as TCAM_READ and its output is noted as "tcam_data&mask". It makes no sense to read from TCAM only the value of "data" or only the value of "mask" since one without the other cannot offer an information about the TCAM bit value, except the case that in the TCAM no bits having value "X" are stored.

The TCAM_DATA_WRITE (address) command will store "data" in the TCAM memory at the location pointed by the "address".

The TCAM_MASK_WRITE (address) command will store the "mask" in the TCAM memory at the location pointed by the "address".

The TCAM_DATA_WRITE and the TCAM_MASK_WRITE commands may be considered as atomic operations and are noted as TCAM_WRITE, since it makes no sense to write "data" in a TCAM memory without also writing the "mask", since a search mechanism cannot work correctly if the "data" and their corresponding "mask" are not consistent.

Only 3 combinations, out of the 4 combinations "data" and "mask" can take, are allowed for a TCAM bit. The TCAM bit can take only 3 values '0', '1' and 'X'. If the TCAM bit value is "X" the comparison of the respective bit with the correspondent bit of the "key" will return a match even if the "key" bit is '0' or '1'.

| "data" | "mask" | TCAM bit value |
|---|---|---|
| 0 | 0 | X (don't care) |
| 0 | 1 | 0 |
| 1 | 0 | 1 |
| 1 | 1 | not-allowed |

The TCAM_SEARCH (key) command will return the "tcam_address" which points to the first location, starting from 0, for which the bits of the "key" indicated by the "mask" stored at the respective location match with the "data" bits stored at the respective location indicated by the "mask" stored at the respective location.

The TCAM_SEARCH (key) command may also return a vector, "tcam_match", having a width equal with the number of locations of the TCAM. Each bit of the "tcam_match" vector may be considered as a flag which indicates that the correspondent TCAM location provides a hit as response to the search operation.

For the RAM there are 2 commands which can be addressed:

The RAM_READ (address) command will return the "data" and the "mask" stored in the additional RAM memory at the location pointed by the "address". The output of this operation is noted as "ram_data&mask".

The RAM_WRITE (address) command will store "data" and a corresponding "mask" in the additional RAM memory at the location pointed by the "address".

Furthermore, two complex commands, which are used to invalidate an entry and to refresh an entry, are defined:

The INVALIDATE(address) command will delete/invalidate the information stored at a location pointed by the "address" in the TCAM and RAM memories in a way that said location will not be considered in the search process.

The REFRESH (address) command will restore the information stored at a location pointed by the "address" in the TCAM and RAM memories such that the location will be considered in the search process.

The TCAM_SEARCH (key) command mentioned above is characterized by general TCAM search mechanism rules. The main characteristics of the TCAM search procedure are explained in more details in the following text.

FIG. 1 represents general scheme of RAM and TCAM memory arrays and the main components involved in a TCAM search procedure. Each location in TCAM memory 110 has a correspondent location in RAM memory 115, which can be accessed using the same Address 105.

The term "memory array" in general can refer to a TCAM or RAM. Each memory (TCAM, RAM) may be seen as an addressable array of locations. Each location can store a data having a fixed width. A TCAM_SEARCH refers to a search operation in a TCAM. The term "memory array search" refers to a search operation in any memory.

FIG. 1 shows a TCAM search 270 mechanism. Input data of the TCAM search mechanism is given by a search key 100. The TCAM search 270 mechanism is initiated by applying said search key 100 against a table of stored data in a TCAM memory 110. The aim of a data search is to determine if any data in the memory 110 array perfectly match to the search key 100, and to return an address 150 of data that matches with the search key 100.

The table of stored data in the TCAM memory 110 contains data TCAM Data 1, TCAM Data 2, . . . , TCAM Data m, stored on different addresses. The entry (data) with the lowest address has the highest priority in a TCAM memory array.

The TCAM memory 110 represents a word array that consists of stored data entries. Each stored data has an associated match line 130 that indicates whether the search key 100 and stored data TCAM Data 1, TCAM Data 2, . . . , TCAM Data m are identical (match case), or are different (mismatch case). Match lines 130 are coupled with corresponding bits in the match register 120. If there is a match, binary 1 will be placed in match register 120, or binary 0 in the case of mismatch. The match lines 130 are fed to an encoder 140 that generates a match location corresponding to the match line 130 that is in the match state.

The encoder 140 is used in a TCAM memory 110 implementation where a single match in the match-register 120 is expected. More specifically, the TCAM search 270 mechanism executed for the search key 100 will return the TCAM address 150 which is the first location, starting from address zero in the TCAM memory array, for which the bits of the search key 100 match with the data bits stored at the same respective address location and indicated by the mask stored at the respective location in the TCAM 110.

In a TCAM memory array implementation where the TCAM search 270 mechanism generates multiple matches, i.e. a search-match vector, a priority encoder 140 can be used. The aim of such a priority encoder 140 is to resolve multiple matches and to encode the best match from the search-match vector 135. In this case, for every data match in the TCAM 110, the binary 1 will be placed in a match register 120. Once the TCAM memory array is searched, a priority encoder 140 determines the highest priority match from match vector 135 and encodes its address 150 location into binary format. According to previously described, the TCAM search mechanism return a vector, TCAM match, that is having a width equal to the length of TCAM 110. Each bit of the TCAM match vector can be considered as a flag which indicates that the correspondent TCAM location provides a hit as response to the search operation.

In case the priority encoder 140 is present, if there is no match, the TCAM search 270 mechanism will indicate that the input key was not found.

Based on the above detailed description how a search in a TCAM memory works, three embodiments of the proposed TCAM error detection method that describe the main phases of the presented invention are described in the following.

Figure 2:
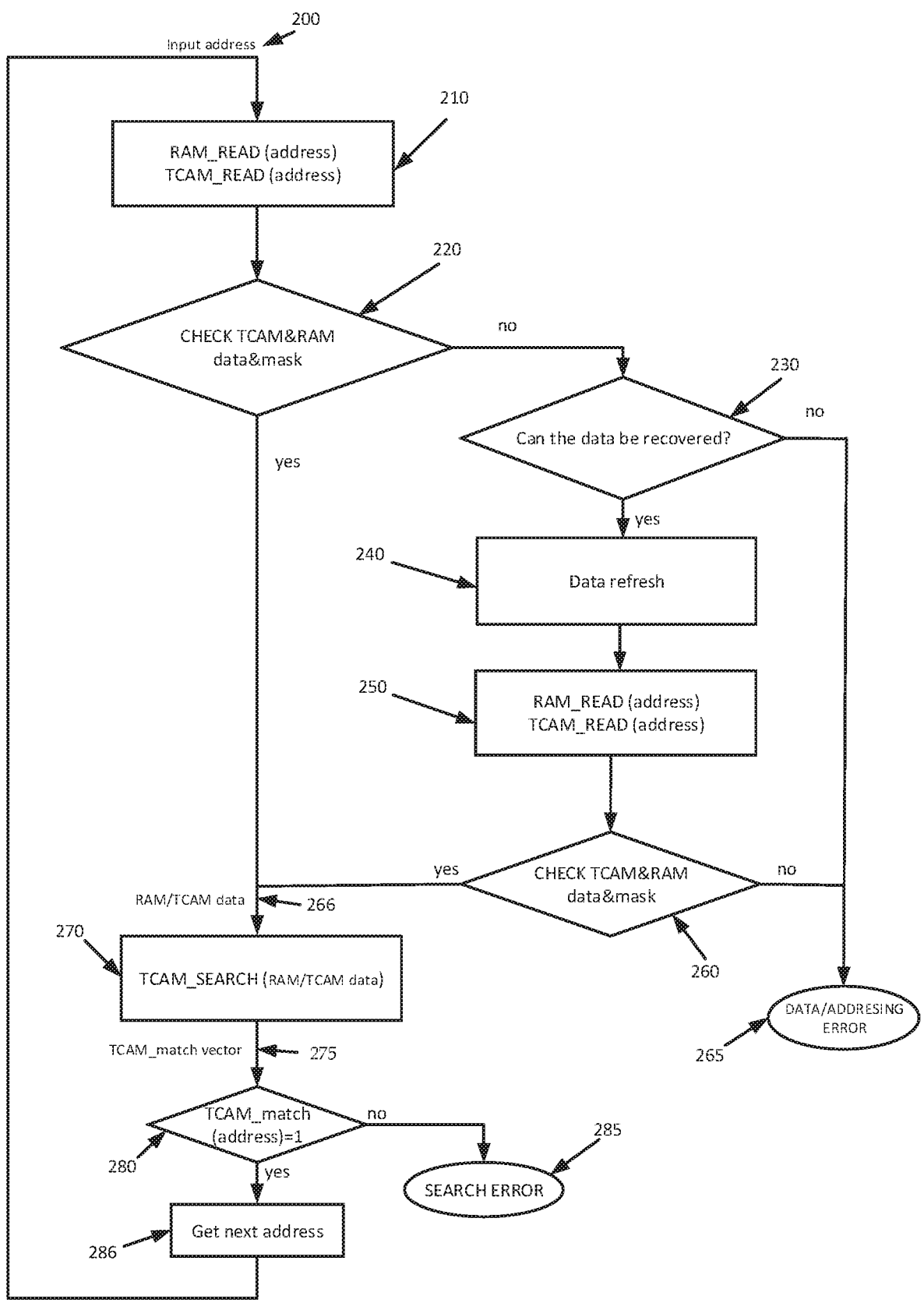
FIG. 2 represents a chart diagram of a first embodiment of the present invention when the result of an inner search operation is a match vector.

FIG. 2 describes a first embodiment of a method according to the invention. In particular, FIG. 2 shows a state chart of a proposed TCAM error detection method which considers the case that the result of the TCAM_SEARCH phase 270 is a match vector output. The method uses additional RAM memory array which has the same number of locations as the TCAM memory array. In both memories, TCAM and RAM, corresponding entries which consist of data and their corresponding mask are placed at the same address locations.

The detection method starts with the TCAM_READ and RAM_READ 210 commands according to which read operations at a specified input address 200 of the TCAM and the additional RAM memory are performed. These read operations involve three operations, which preferably are executed atomically, i.e. the operations TCAM_MASK_READ, TCAM_DATA_READ and RAM_READ. After said data and mask read from both memories, a check 220 phase follows. In this check phase 220 the data and mask read from the TCAM at the location pointed by the input address 200 are compared with the data and mask read from RAM at the location pointed by the same input address 200.

This simple check phase 220 may include a parity bit or checksum examination, which is preferably executed in cases when only low bandwidth of TCAM and RAM is available. However, if the available TCAM bandwidth is high, in order to save RAM resources, it is appropriate to implement additional, more complex methods of data checking in the check phase 220, like an error correction code (ECC) algorithm or a hash algorithm, which algorithms are capable to detect and find errors during run-time, for example during run-time of an IP core which uses the TCAM. If the result of the check operation 220 is positive ("yes"), the method continues with the TCAM_SEARCH 270, otherwise ("no") a recovery check 230 is performed.

In case that the recovery check 230 yields a comparison result, which is false, a data integrity error flag 265 is raised. Otherwise, a data REFRESH operation 240 is executed where a recovery is done. For example, the data stored in TCAM is recovered in case that it was affected by an SEU (Single Event Upset) which makes one or many bits of data to change their values. The refresh operation 240 is implemented in both memories.

Depending by the implementation, the comparison may be done between the data and the mask stored in TCAM with the data and the mask in RAM. Or, for example, the comparison can be done between an ECC/parity/CRC applied to the data and the mask read from TCAM and the value of ECC/parity/CRC stored in RAM when the data and the mask were written in TCAM.

Then, the method again performs TCAM_READ and RAM_READ operation 250 of the TCAM and RAM at the specified address 200. The data and mask read from TCAM and RAM at the location pointed by the input address 200 are compared in a check operation 260. If the result of check operation 260 is negative ("no") a data integrity error flag 265 is raised, otherwise, the method continues with the TCAM_SEARCH 270. Two types of integrity errors in phase 265 refer to the integrity of the stored data and to addressing errors. Checking is done in the same way as in the phase 220.

If the result in phase 260 is correct ("yes") then the method with the data from the RAM or TCAM memory goes to the phase 270 which does TCAM_SEARCH. In the TCAM_SEARCH 270 as described in FIG. 1 a TCAM memory array search is performed based on the key consisting of the data read from RAM or TCAM memory and obtained after check operations 220 or 260. This embodiment considers the case that a TCAM match vector 275 is received as result of the TCAM_SEARCH 270. A TCAM_match 280 checks whether the result of the TCAM_SEARCH 270, that is the flag pointed by the address 200 from TCAM_match vector 275, is binary 1, and if it does the method moves to the next input address 286 provided by the scrubbing mechanism, and the whole proposed error detection method may be repeated, otherwise, a search error flag 285 is raised.

Figure 3:
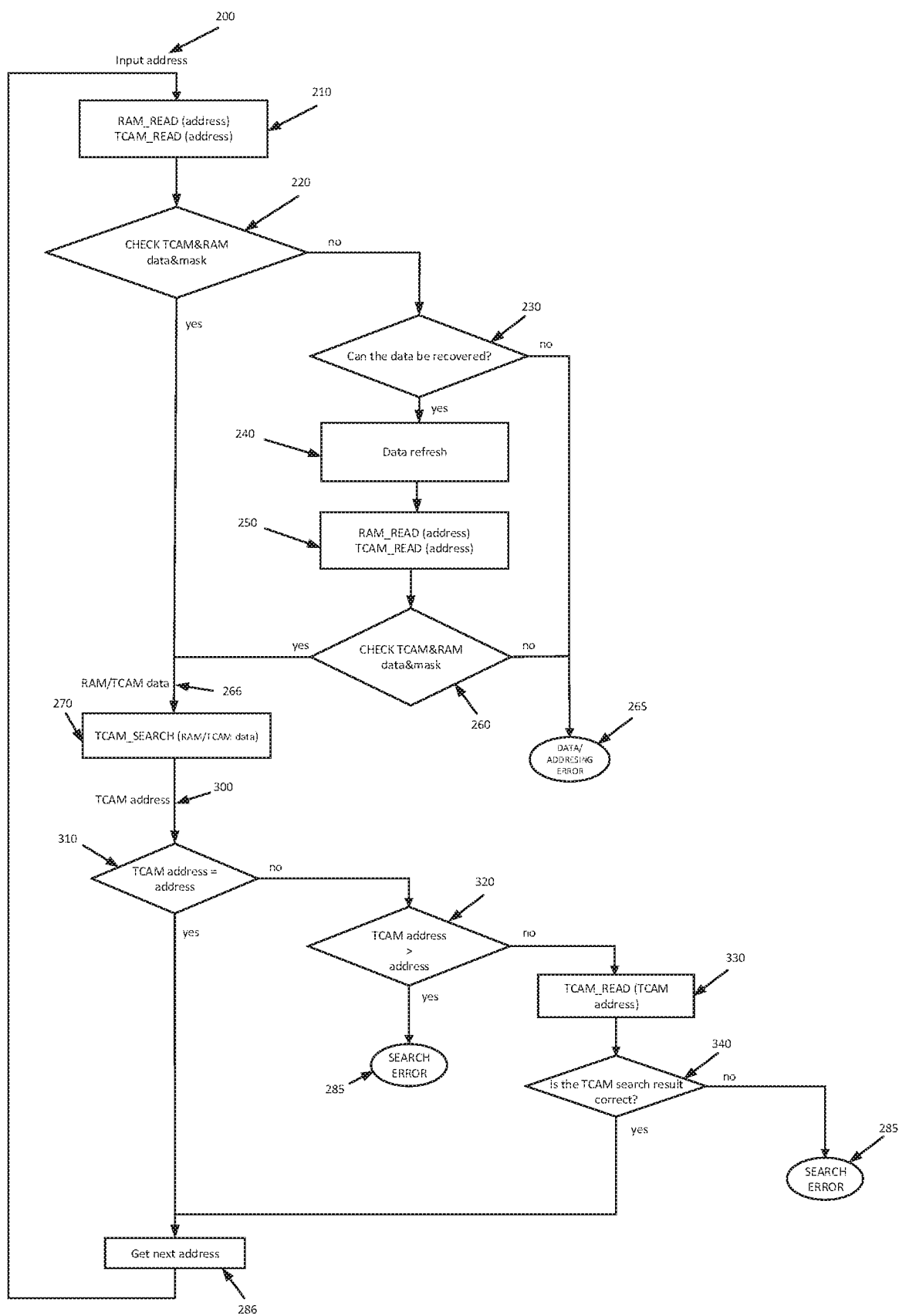
FIG. 3 represents a chart diagram of a second embodiment of the present invention when the result of an inner search operation is an address.

FIG. 3 represents a state chart of a second embodiment of the invention which discloses the case that the output of the TCAM_SEARCH 270 phase is a single TCAM address 300.

As it is described in the previous embodiment according to FIG. 2, corresponding entries are placed at the same address locations in TCAM and RAM memories. The detection method reads the data and mask at the input address 200 from both memories followed by the check 220 phase in order to compare the data and mask read from TCAM and RAM memories. Read in TCAM and RAM 210 involves three atomic operations, i.e. operations: TCAM_MASK_READ, TCAM_DATA_READ and RAM_READ. This simple check 220 phase including parity bit or checksum examination is applied when TCAM and RAM low memory bandwidth is available. However, if the available TCAM and RAM bandwidth is high, in order to save RAM resources, more complex methods of data checking in the check phase 220 may be implemented, like ECC or hash algorithms, which are capable to detect and find errors during the run-time.

When the result of the check 220 is positive, the method continues with the TCAM_SEARCH 270, otherwise a recovery check 230 is performed. If the result of the recovery check 230 is false, a data integrity error flag 265 is raised. Otherwise, a data recovery is executed in a data refresh operation 240. After the recovering process, the method repeats the read 250 of TCAM and RAM operation at the specified address 200. The data and mask read from TCAM and RAM memories at the location pointed by the input address 200 are compared again in the check 260 operation, and if the result is negative, a data integrity error flag is raised 265, otherwise, the method continues with the TCAM_SEARCH 270 with the data read taken from the RAM or TCAM memory as input search key.

If the result of the TCAM_SEARCH 270, the TCAM address 300, is identical to the given input address 200, the check 310 directs the method to continue the processing of the next input address 286 provided by a scrubbing mechanism. If the output of the TCAM_SEARCH 270, the TCAM address 300, represents a higher address in the memory array relative to the given input address 200, then the method indicates a search error 285. Otherwise, the TCAM read operation 330 will be performed on the TCAM address 300. A TCAM_SEARCH result validation 340 is checking the condition, if the data and the mask found at the TCAM address 300 may provide a match for the RAM or TCAM data 266 used as input for the TCAM_SEARCH 270. If the result of this check is "no", a search error 285 is indicated. Otherwise, the method moves to the next input address 286 provided by the scrubbing mechanism, and the whole proposed error detection method may be repeated.

Figure 4:
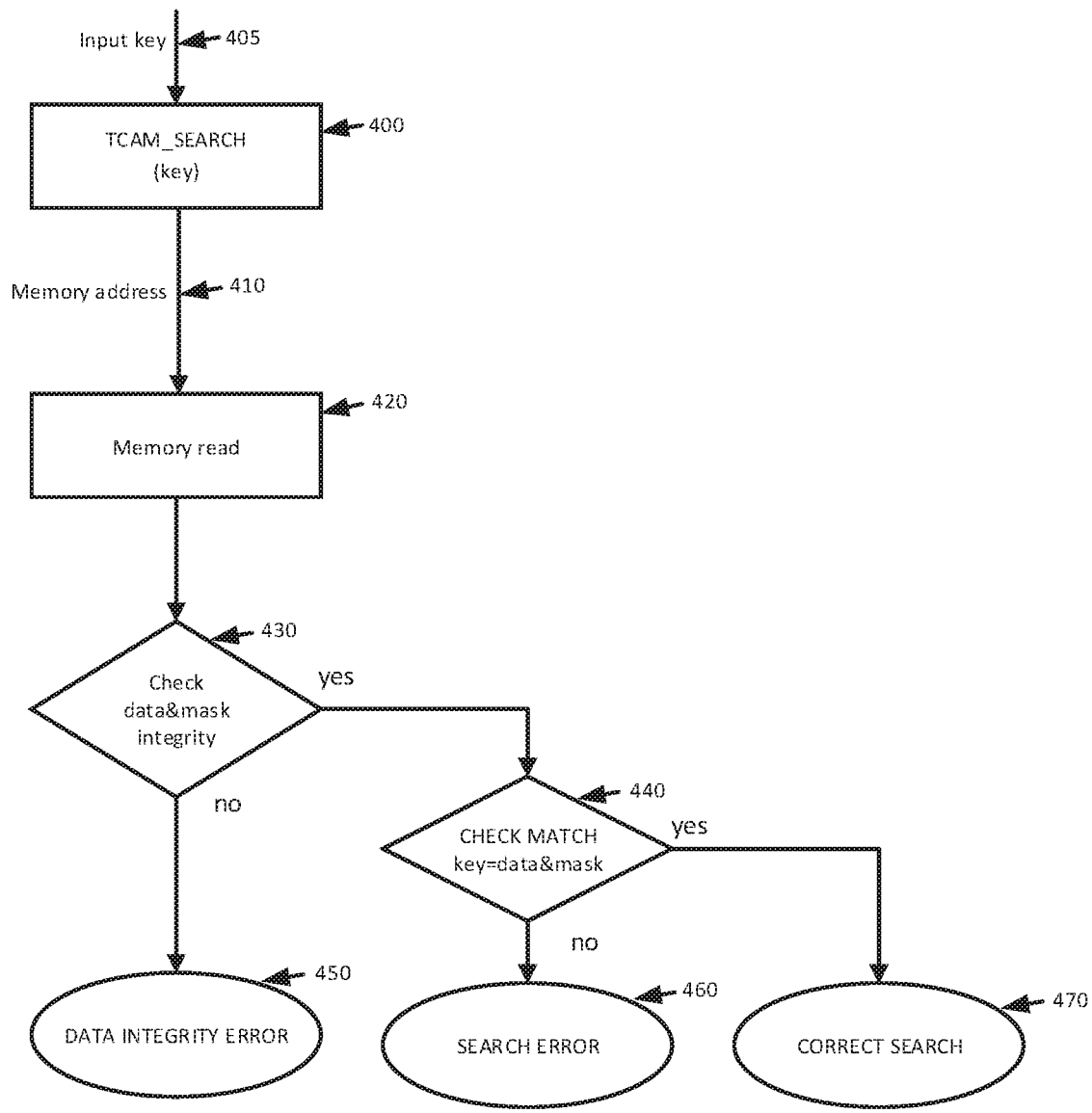
FIG. 4 represents a chart diagram of the third embodiment of the present invention when a TCAM_SEARCH command is requested.

A third embodiment of the invention is shown in FIG. 4, which depicts a detail of a simpler implementation of the method according to the invention, which is initiated by a requested TCAM_SEARCH command 400 with an input key 405. Said input key 405 represents the data that need to be searched, e.g. MAC address, pattern, etc. As illustrated in FIG. 4, the error detection procedure is initiated by a memory address 410 received as an output of an executed TCAM_SEARCH operation 400, and more specifically, it represents the first location in a TCAM memory array that provides a requested match of the input key 405 and a corresponding TCAM entry. Next, if the input key is found in the TCAM, a memory read 420 reads from TCAM and/or from RAM memory, depending on the available TCAM bandwidth, the data and the mask that are located at the memory address 410. In the case of low available bandwidth, a memory read operation 420 is performed at the RAM, otherwise, if the available bandwidth is high, the memory read 420 is performed at the TCAM and RAM. The given procedure is continued with an integrity check 430 of the data and the mask. If the available memory bandwidth is high, more complex methods of data checking may be implemented, i.e. error correction code (ECC) algorithms or hash algorithms, which are capable to detect and find errors in run-time. If an error in data integrity is found, it will be indicated by a data integrity error 450, otherwise a key match check 440 is executed, in which the input search key 405 is compared with the data and the mask located at the address 410 in the memory, either TCAM and/or RAM. If there is no match between the input search key 405 and the data and the mask, a search error 460 will be indicated.

The present invention has been presented within detail embodiments descriptions and the charts that illustrate the implementation of specified procedures and relationships. The described procedures can be implemented in high speed networking devices such as routers for faster address lookup that enables fast routing and packet classification, or in switches where it may be used for building and lookup of MAC address tables. Additionally, the presented invention can be used in other TCAM-based high speed search engines in data compression, pattern matching and artificial intelligence applications. The representative procedures described herein may be implemented on integrated circuits including ASIC, FPGA, etc. This invention is, however, susceptible to modifications and alternative implementations with respect to a given number of embodiments discussed above. For instance, further re-combining or re-ordering of operations described in the embodiments does not depart from the scope of this invention.

The invention claimed is:

1. A method for error detection in a ternary content addressable memory, TCAM, preferably in real-time, wherein the error detection is initiated with a read operation at a specified input address (200), an additional random access memory, RAM, is provided, wherein said RAM has a same number of locations as the TCAM, wherein in both memories, TCAM and RAM, corresponding read data entries (210) which each consist of data and a mask are placed at the same input address locations, and wherein:
  data and mask read operations from TCAM and RAM at the locations pointed by the input address (200) are performed and
  in a first check phase (220) said data and mask read from the TCAM at a location pointed by the input address (200) are compared with the data and mask read from RAM at the location pointed by the same input address (200), and
  if a result of the first check phase (220) is correct, a TCAM_SEARCH phase (270) is executed,
  otherwise a data recovery check (230) is executed, which is followed by a data refresh (240), a second read of data entries (250) stored at said input address (200) in both TCAM and RAM, and a second check phase (260) is executed, in which second phase (260) a comparison of data and masks read from both TCAM and RAM is performed, and
  and wherein the TCAM_SEARCH phase (270) uses the data read from RAM as input search key and returns as an output a TCAM match vector and/or a single TCAM address,
  and wherein a TCAM match check (280) checks
  in a case of a TCAM match vector, whether the result of the TCAM_SEARCH (270), that is a flag pointed by the address (200) from TCAM match vector (275), is binary 1, or
  in the case of a non-matched (false) TCAM single address (300) checked in a TCAM address check (310),
  and if the TCAM address (300) is a lower address than said input address (200), a TCAM read at said TCAM address (300) is performed, and if in a TCAM search validation (340) the TCAM data read at the TCAM address (300) is identical to the data read at the RAM, and wherein preferably the method moves to the next input address (286) provided by the scrubbing mechanism, and the whole proposed error detection method may be repeated.

2. The method of claim 1, wherein a check and phases (220, 260) that use TCAM and RAM low memory bandwidth demanding procedure of data entries check and comparison.

3. The method of claim 1, wherein a check and phases (220, 260) that use TCAM and RAM high memory bandwidth demanding procedure of data entries check and comparison, which includes error correction code or hash algorithms.

4. The method of claim 1, wherein the data recovery check (230) raises a data integrity error flag (265), if the result of the check is false.

5. The method of claim 1, wherein a second check (260) phase is provided that raises a data integrity error flag (265), if the result of the check is false.

6. The method of claim 1, wherein a TCAM match check (280) is executed, which finishes the error detection if the result of the check is a binary 1, otherwise it raises a search error flag (285).

7. The method of claim 1, wherein a TCAM search validation (340) is executed, which raises a search error flag (285), if the result of a comparison of data read at the TCAM address (300) does not provide a match in the RAM.

8. A memory device for the use in the method of claim 1, the memory device comprising:
  a ternary content addressable memory, TCAM, and
  an additional random access memory, RAM, wherein said RAM has the same number of locations as the TCAM, wherein in both memories, TCAM and RAM, corresponding read data entries (210) which each consist of data and a mask may be placed at the same address locations.

9. A computer network comprising one or more memory devices according to claim 8.

10. A device comprising:
  a memory device which comprises a ternary content addressable memory, TCAM, and an additional random access memory, RAM, wherein said RAM has the same number of locations as the TCAM, wherein in both memories, TCAM and RAM, corresponding read data entries (210) which each consist of data and a mask may be placed at the same address locations,
  wherein the networking device is configured to carry out the method of error detection according to claim 1.

11. The device of claim 10, which is a high speed networking device or a TCAM-based high speed search engine.

12. The device of claim 11, wherein the high speed networking device is a router or a switch.

13. A computer network comprising one or more devices according to claim 10.

14. A method for error detection in a ternary content addressable memory, TCAM, preferably in real-time, wherein an additional random access memory, RAM, is provided, wherein said RAM has a same number of locations as the TCAM, wherein in both memories, TCAM and RAM, corresponding read data entries which each consist of data and a mask are placed at the same input address locations, and wherein:
  the error detection is initiated by a received input address (410) outputted from a TCAM_SEARCH command (400), wherein a memory read (420) reads data and the mask stored at said input addresses (410) in either TCAM and/or RAM, and wherein a check (430) checks a integrity of said data and the mask, and if no error is found, a key match check (440) is executed, in which the input search key (405) is compared with the data and the mask located at the address (410) in the memory, either TCAM and/or RAM.

15. The method of claim 14, wherein the read (420) of the data value and the mask is performed at the RAM, in particular in the case of low available bandwidth of the TCAM, or, in particular if the available bandwidth of the TCAM is high, the memory read (420) is performed at the TCAM.

16. The method of claim 14, wherein an integrity check (430) of the data and the mask is executed.

17. The method of claim 14, wherein a key match check (440) is executed, and if there is no match between the input search key (405) and the data and the mask read from address (410), a search error (460) will be indicated.

\* \* \* \* \*